United States Patent [19] [11] Patent Number: 4,771,432
Yano et al. [45] Date of Patent: Sep. 13, 1988

[54] SEMICONDUCTOR LASER WHICH REDUCES THE COHERENCY OF THE OSCILLATION SPECTRUM

[75] Inventors: Seiki Yano, Kashihara; Saburo Yamamoto, Nara; Sadayoshi Matsui, Tenri; Hiroshi Hayashi, Soraku, all of Japan

[73] Assignee: Sharp Kabushiki Kaisha, Osaka, Japan

[21] Appl. No.: 835,471

[22] Filed: Mar. 3, 1986

[30] Foreign Application Priority Data

Mar. 6, 1985 [JP] Japan .................................. 60-45667

[51] Int. Cl.⁴ .............................................. H01S 3/19
[52] U.S. Cl. ........................................ 372/45; 372/46; 372/48
[58] Field of Search ...................... 372/48, 44, 45, 46; 357/17

[56] References Cited

U.S. PATENT DOCUMENTS 4,016,505 4/1977 Itoh et al. ............................. 372/45
4,328,469 5/1982 Scifres et al. ......................... 372/48

OTHER PUBLICATIONS

Matsui, S., et al., Appl Phys Lett 43(3), 1983, pp. 219-221.
W. T. Tsang, Applied Physics Letters, vol. 38, No. 11, Jun. 1981, pp. 835-837.
Patent Abstracts of Japan, vol. 6, No. 238 (E-144) [1116], Nov. 26, 1982; & JP-A-57 139 983 (Nippon Denki K.K.) 30-08-1982.
Patent Abstracts of Japan, vol. 6, No. 254 (E-148) [1132], Dec. 14, 1982; & JP-A-57 153 486 (Nippon Denki K.K.) 22-09-1982.
Patent Abstracts of Japan, vol. 9, No. 19 (E-292) [1742], Jan. 25, 1985; & JP-A-59 167 083 (Nippon Denshin Denwa Kosha) 20-09-1984.

Primary Examiner—James W. Davie
Assistant Examiner—Georgia Y. Epps
Attorney, Agent, or Firm—Ciotti & Murashige, Irell & Manella

[57] ABSTRACT

A semiconductor laser comprising a middle-positioned active layer sandwiched between the lower-positioned active layer and the upper-positioned active layer, the refractivity of each of said lower- and upper- positioned active layers being slightly different from that of the middle-positioned active layer.

3 Claims, 2 Drawing Sheets

SEMICONDUCTOR LASER WHICH REDUCES THE COHERENCY OF THE OSCILLATION SPECTRUM

BACKGROUND OF THE INVENTION

1. Field of the Invention

This invention relates to a semiconductor laser which achieves expansion of the oscillation spectrum width, resulting in the reduction of coherency of the oscillation spectrum.

2. Description of the Prior Art

Semiconductor lasers have been used as light sources such as for the regeneration of optical discs, for optical-measuring systems, and for optical communication systems. However, noise is produced with these semiconductor lasers due to reflected light from the optical systems, which makes it difficult to establish precise optical systems incorporating the semiconductor lasers.

The inventors of the present invention have developed a semiconductor laser which comprises a striped structure achieving self-excited oscillation due to relaxation fluctuation of carriers in semiconductor materials to thereby attain oscillation with a great spectrum width, resulting in a semiconductor laser in which noise due to reflected light can be suppressed (Appl. Phys. Letter., vol. 43, No. 3, 1983, pp 219). However, in this semiconductor laser, the oscillation wavelength is modulated by a specific frequency, resulting in an oscillation spectrum with dual peaks, as shown in FIG. 3(a), each of which is steep. Therefore, this semiconductor laser cannot attain the reduction of coherency of the oscillation spectrum.

SUMMARY OF THE INVENTION

The semiconductor laser of this invention which overcomes the above-discussed and numerous other disadvantages and deficiencies of the prior art, comprises a middle-positioned active layer sandwiched between the lower-positioned active layer and the upper-positioned active layer, the refractivity of each of said lower- and upper- positioned active layers being slightly different from that of the middle-positioned active layer.

The refractivity of each of said three active layers is, in a preferred embodiment, regulated by the concentration of p-impurities. Alternatively, the refractivity of each of said three active layers is, in a preferred embodiment, regulated by the regulation of the AlAs mode fraction (i.e., x) of a $Ga_{1-x}Al_xAs$ mixed crystal to be used as the active layer.

The refractivity of said middle-positioned active layer is, in a preferred embodiment, higher than that of each of the other active layers by the order of $10^{-3}$.

Thus, the invention described herein makes possible the object of providing a semiconductor laser which achieves the expansion of the oscillation spectrum width, resulting in the sufficient reduction of coherency of the oscillation spectrum, so that noise due to reflected light can be suppressed.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 3A:
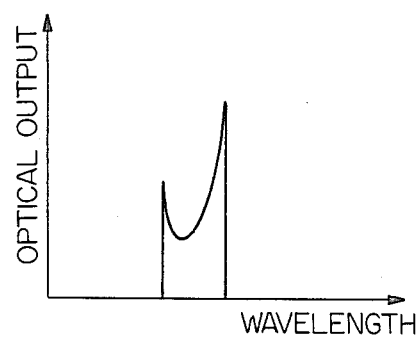
FIG. 3(a) is a graph showing the oscillation spectrum achieved by a conventional semiconductor laser.
Figure 3B:
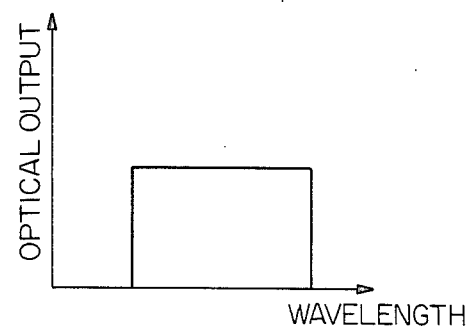
FIG. 3(b) is a graph showing the oscillation spectrum achieved by a semiconductor laser of this invention.

In order to achieve an oscillation spectrum with an expanded width, as shown in FIG. 3(b) notwithstanding the oscillation wavelength being modulated by a specific frequency, the optical output P(t) of semiconductor lasers must be as follows:

$$P(t) = 4/\pi t\ (\sin bt - \sin at) \tag{1}$$

wherein a is the saturation time of carriers in the direction at right angles to the junction, b is the saturation time of carriers in the direction horizontal to the junction, and t is the time.

In order to achieve such an optical output, the semiconductor laser of this invention is designed in a manner to comprise an active layer sandwiched between the outer active layers with a refractivity which is slightly different from that of said middlepositioned active layer.

EXAMPLE

Figure 1:
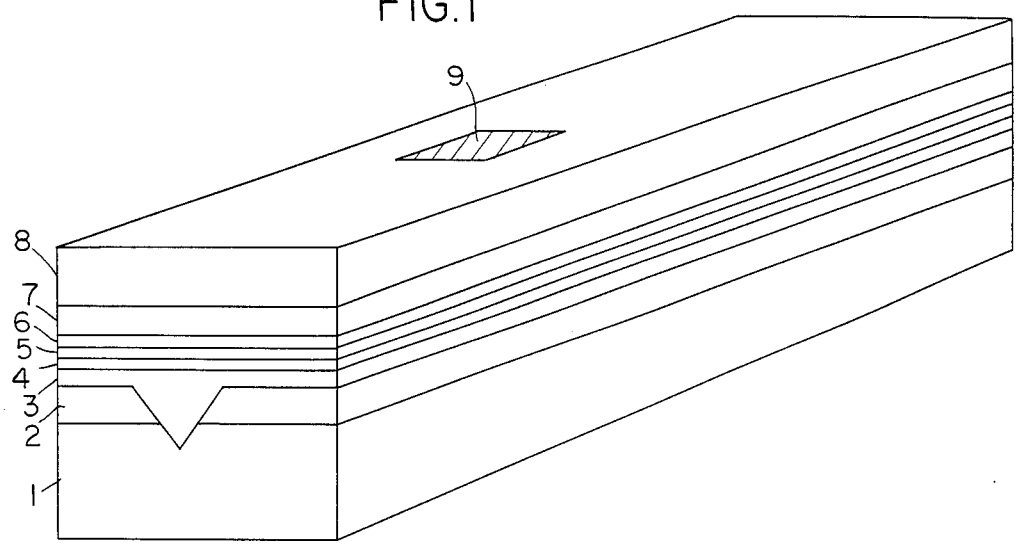
FIG. 1 is a perspective view showing the structure of a semiconductor laser of this invention.

FIG. 1 shows a VSIS (V-channeled substrate inner stripe) semiconductor laser of this invention, which comprises a p-GaAs substrate 1, an n-GaAs current blocking layer 2, a p-GaAlAs first cladding layer 3, a p-GaAs lower-positioned active layer 4 with a refractivity which is slightly different from that of a middle-positioned active layer 5 mentioned below, the p-GaAs middle-positioned active layer 5, a p-GaAs upper-positioned active layer 6 with a refractivity which is slightly different from that of the middle-positioned active layer 5, an n-GaAlAs second cladding layer 7, and an n-GaAs cap layer 8, in sequence. Reference numeral 9 indicates an area to be irradiated by protons. As mentioned above, the active layers 4, 5 and 6 form a triple-layered structure, and the refractivity of each of the active layers is regulated by the concentration of p-impurities such that the middlepositioned active layer 5 creates a refractivity which is higher than that of each of the outer-positioned active layers 4 and 6 by the order of $10^{-3}$.

Figure 2A:
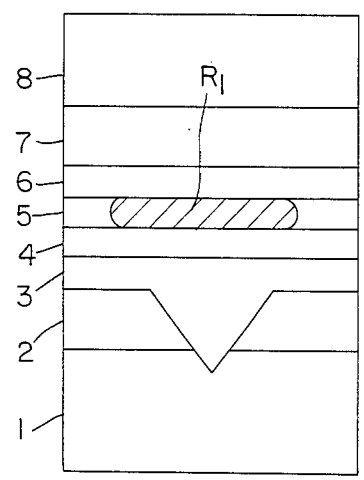
FIGS. 2(a) and 2(b), respectively, show the distribution of optical intensity at the resonant facet.
Figure 2B:
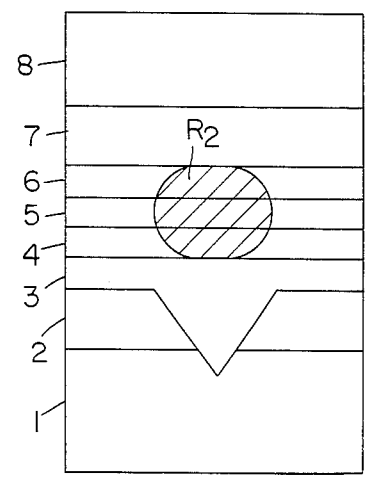

In the semiconductor laser with a VSIS structure having the above-mentioned active layers 4, 5 and 6, it was found by spectroscopical measurement of the optical intensity that the distribution of optical intensity at the resonant facet fluctuates between the light emitting regions R1 (shown in FIG. 2(a)) and R2 (shown in FIG. 2(b)). That is, at a time $t_1$ when laser light is confined within the active layer 5 having a high refractivity, the laser light attains a weak optical-coupling with the n-GaAs current blocking layer 2, and accordingly the difference in the refractivity anywhere in the active layer 5 cannot be created in the direction horizontal to the junction so that the laser light exhibits the distribution which spreads transversely as shown in FIGS. 2(a). Since the laser light is confined within the active layer 5 having a high refractivity, the carrier density of the active layer 5 is maintained at a low level, and carriers flow from each of the active layers 4 and 6 to the active layer 5 so as to balance the carrier densities between these active layers, which causes the reduction of the refractivity of the active layer 5 so that the laser light spreads into the outer-positioned active layers 4 and 6, thereby attaining a strong optical coupling between the laser light and the current blocking layer 2 and creating a difference in the refractivity of the active layer 5 in the direction horizontal to the junction. As a result, the laser light exhibits a distribution which spreads vertically, as shown in FIG. 2(b). The movement of carriers arises transversely, as well, resulting in the interference between the movements of carriers in the vertical direction and in the transverse direction. The relaxation time of carriers in the direction vertical to the junction is different from that of carriers in the transverse direction. The relaxation time in the vertical direction is 1/a, and the relaxation time in the transverse direction is 1/b which is longer than 1/a, resulting in the fluctuation of the optical output such as that represented by equation (1), wherein the term 1/t is determined by the time constant of the area 9 to be irradiated by protons, which is positioned in the resonance direction and which functions as a saturatable absorber with a long time constant. In this example, the area 9 is designed in a manner to inject protons into the semiconductor laser therethrough over the region with a length of 10 μm in the resonance direction.

The semiconductor laser obtained in the above-mentioned manner has an oscillation spectrum width of as large as 100 GHZ, as shown in FIG. 3(b), and thus the reduction of coherency of the oscillation spectrum can be attained to a great extent and the semiconductor laser can be extremely stabilized despite reflected light.

In the above-mentioned example, the regulation of the refractivities of the active layers 4, 5 and 6 was carried out by the concentration of p-impurities, but it is not limited thereto. It can be carried out by the regulation of the AlAs mole fraction (i.e., x) of a $Ga_{1-x}Al_xAs$ mixed crystal to be used as the active layer. The present invention is, of course, applicable not only to GaAs-GaAlAs semiconductor lasers but also to other semiconductor lasers such as InP-InGaAsP semiconductor lasers.

It is understood that various other modifications will be apparent to and can be readily made by those skilled in the art without departing from the scope and spirit of this invention, Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. In a semiconductor laser comprising a resonant cavity, said resonant cavity comprising a middle-positioned active layer, a lower-positioned active layer, and an upper-positioned active layer, said middle-positioned active layer being sandwiched between said lower-positioned active layer and said upper-positioned active layer, wherein the refractivity of said middle-positioned active layer is higher than that of each of said upper-positioned active layers by about $10^{-3}$, so that the distribution of laser light fluctuates between the state in which laser light is confined within the middle-positioned active layer and the state in which laser light is confined within said middle-positioned, lower-positioned and upper-positioned active layers.

2. A semiconductor laser according to claim 1, wherein the refractivity of each of said three active layers is regulated by the concentration of p-impurities.

3. A semiconductor laser according to claim 1, wherein the refractivity of each of said three active layers is regulated by the regulation of the AlAs mode fraction (i.e., x) of a $Ga_{1-x}Al_xAs$ mixed crystal to be used as the active layer.

* * * * *

UNITED STATES PATENT AND TRADEMARK OFFICE
CERTIFICATE OF CORRECTION

PATENT NO.  : 4,771,432

DATED       : 13 September 1988

INVENTOR(S) : Seiki Yano, Saburo Yamamoto, Sadayoshi Matsui and Hiroshi Hayashi

It is certified that error appears in the above-identified patent and that said Letters Patent is hereby corrected as shown below:

At column 4, line 26 (claim 1), insert --and lower-positioned-- between "positioned" and "active".

Signed and Sealed this

Thirteenth Day of July, 1993

Attest:

MICHAEL K. KIRK

*Attesting Officer*    *Acting Commissioner of Patents and Trademarks*